United States Patent
Hirayama (10) Patent No.: US 9,077,367 B2
(45) Date of Patent: Jul. 7, 2015

(54) BIT LENGTH CONVERTING CIRCUIT FOR FLOATING-POINT NUMBERS, AND VIBRATION CORRECTION CONTROL CIRCUIT USING THE BIT LENGTH CONVERTING CIRCUIT

(75) Inventor: Hideki Hirayama, Gifu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 423 days.

(21) Appl. No.: 13/428,905

(22) Filed: Mar. 23, 2012

(65) Prior Publication Data

US 2012/0242848 A1 Sep. 27, 2012

(30) Foreign Application Priority Data

Mar. 24, 2011 (JP) .................. 2011-066489

(51) Int. Cl.
*H03M 7/24* (2006.01)
*H04N 5/232* (2006.01)

(52) U.S. Cl.
CPC ............. *H03M 7/24* (2013.01); *H04N 5/23258* (2013.01)

(58) Field of Classification Search
None
See application file for complete search history.

(56) References Cited

U.S. PATENT DOCUMENTS

| 7,126,501 B2 * | 10/2006 | Moriya et al. ................. 341/50 |
| 2008/0055426 A1 * | 3/2008 | Pertsel et al. ............. 348/223.1 |
| 2011/0099295 A1 * | 4/2011 | Wegener ....................... 709/247 |
| 2012/0084335 A1 * | 4/2012 | Chen ............................ 708/204 |

FOREIGN PATENT DOCUMENTS

| JP | 2007-192847 | 8/2007 |
| JP | 2010-102431 | 5/2010 |

\* cited by examiner

*Primary Examiner* — Albert Cutler
(74) *Attorney, Agent, or Firm* — Rennie William Dover (57) ABSTRACT

The bit length reducing unit reduces the bit length of an operand expressed by a floating-point number and outputs the operand to a computing unit. The bit length increasing unit increases the bit length of the result value of operation represented by the floating-point number inputted from the computing unit and restores the original bit length. The bit length reducing unit discards a preset number of higher-order bits of the exponent part of the floating-point number and at the same time adds a positive or negative offset value to the exponent part with the higher-order bits discarded, according to an application to be executed by the computing unit. The bit length increasing unit restores the bits discarded by the bit length reducing unit 11 from the exponent part of the floating-point number and at the same time subtracts an offset value from the exponent part.

8 Claims, 9 Drawing Sheets

| | EXPONENT PART 8bit | ⇔ | EXPONENT PART 5bit | | | | EXPONENT PART 8bit | ⇔ | EXPONENT PART 5bit | EXPONENT PART 5bit |
|---|---|---|---|---|---|---|---|---|---|---|
| | 1001_0001 | | 1_1111 | | | $2^{-5}$ | 0111_1010 | | 0_1010 | 1_0110 |
| $2^{17}$ | 1001_0000 | | 1_1111 | | | $2^{-6}$ | 0111_1001 | | 0_1001 | 1_0101 |
| $2^{16}$ | 1000_1111 | | 1_1111 | C1 | | $2^{-7}$ | 0111_1000 | | 0_1000 | 1_0100 |
| $2^{15}$ | 1000_1110 | | 1_1110 | | | $2^{-8}$ | 0111_0111 | | 0_0111 | 1_0011 |
| $2^{14}$ | 1000_1101 | | 1_1101 | | | $2^{-9}$ | 0111_0110 | | 0_0110 | 1_0010 |
| $2^{13}$ | 1000_1100 | | 1_1100 | | | $2^{-10}$ | 0111_0101 | | 0_0101 | 1_0001 |
| $2^{12}$ | 1000_1011 | | 1_1011 | | | $2^{-11}$ | 0111_0100 | | 0_0100 | 1_0000 |
| $2^{11}$ | 1000_1010 | | 1_1010 | | | $2^{-12}$ | 0111_0011 | | 0_0011 | 0_1111 |
| $2^{10}$ | 1000_1001 | | 1_1001 | | | $2^{-13}$ | 0111_0010 | | 0_0010 | 0_1110 |
| $2^{9}$ | 1000_1000 | | 1_1000 | | | $2^{-14}$ | 0111_0001 | | 0_0001 | 0_1101 |
| $2^{8}$ | 1000_0111 | | 1_0111 | | | $2^{-15}$ | 0111_0000 | | 0_0000 | 0_1100 |
| $2^{7}$ | 1000_0110 | | 1_0110 | EXPONENT PART 5bit | | $2^{-16}$ | 0110_1111 | | 0_0000 | 0_1011 |
| $2^{6}$ | 1000_0101 | | 1_0101 | | | $2^{-17}$ | 0110_1110 | | 0_0000 | 0_1010 |
| $2^{5}$ | 1000_0100 | | 1_0100 | 1_1111 C2 | | $2^{-18}$ | 0110_1101 | | 0_0000 | 0_1001 |
| $2^{4}$ | 1000_0011 | | 1_0011 | 1_1111 | | $2^{-19}$ | 0110_1100 | | 0_0000 | 0_1000 |
| $2^{3}$ | 1000_0010 | | 1_0010 | 1_1110 | | $2^{-20}$ | 0110_1011 | | 0_0000 | 0_0111 |
| $2^{2}$ | 1000_0001 | | 1_0001 | 1_1101 | | $2^{-21}$ | 0110_1010 | | 0_0000 | 0_0110 |
| $2^{1}$ | 1000_0000 | | 1_0000 | 1_1100 | | $2^{-22}$ | 0110_1001 | | 0_0000 | 0_0101 |
| $2^{0}$ | 0111_1111 | | 0_1111 | 1_1011 | | $2^{-23}$ | 0110_1000 | | 0_0000 | 0_0100 |
| $2^{-1}$ | 0111_1110 | | 0_1110 | 1_1010 | | $2^{-24}$ | 0110_0111 | | 0_0000 | 0_0011 |
| $2^{-2}$ | 0111_1101 | | 0_1101 | 1_1001 | | $2^{-25}$ | 0110_0110 | | 0_0000 | 0_0010 |
| $2^{-3}$ | 0111_1100 | | 0_1100 | 1_1000 | | $2^{-26}$ | 0110_0101 | | 0_0000 | 0_0001 |
| $2^{-4}$ | 0111_1011 | | 0_1011 | 1_0111 | | $2^{-27}$ | 0110_0100 | | 0_0000 | 0_0000 |
| | | | | | | $2^{-28}$ | 0110_0011 | | 0_0000 | 0_0000 |
| | | | | | | $2^{-29}$ | 0110_0010 | | 0_0000 | 0_0000 |

| bit LENGTH | MAXIMUM ERROR (EXPONENT:$2^4$) FOR EACH MULTIPLICATION OR ADDITION | MAXIMUM ERROR OF FILTER AS A WHOLE (VALUE AT LEFT $*$ 100) (100 MULTIPLICATIONS AND ADDITIONS FOR FILTER AS A WHOLE) |
|---|---|---|
| 23 | $1/2^{23} \cdot 2^4 = 0.0001907\%$ | $0.0001907\% \cdot 100 = 0.01907\%$ |
| 22 | $1/2^{22} \cdot 2^4 = 0.0003815\%$ | $0.0003815\% \cdot 100 = 0.03815\%$ |
| 21 | $1/2^{21} \cdot 2^4 = 0.0007629\%$ | $0.0007629\% \cdot 100 = 0.07629\%$ |
| 20 | $1/2^{20} \cdot 2^4 = 0.001526\%$ | $0.001526\% \cdot 100 = 0.1526\%$ |
| 19 | $1/2^{19} \cdot 2^4 = 0.003052\%$ | $0.003052\% \cdot 100 = 0.3052\%$ |
| ○ 18 | $1/2^{18} \cdot 2^4 = 0.006104\%$ | $0.006104\% \cdot 100 = 0.6104\%$ |
| 17 | $1/2^{17} \cdot 2^4 = 0.01221\%$ | $0.01221\% \cdot 100 = 1.221\%$ |
| 16 | $1/2^{16} \cdot 2^4 = 0.02441\%$ | $0.02441\% \cdot 100 = 2.441\%$ |
| 15 | $1/2^{15} \cdot 2^4 = 0.04883\%$ | $0.04883\% \cdot 100 = 4.883\%$ |

BIT LENGTH CONVERTING CIRCUIT FOR FLOATING-POINT NUMBERS, AND VIBRATION CORRECTION CONTROL CIRCUIT USING THE BIT LENGTH CONVERTING CIRCUIT

This application is based upon and claims the benefit of priority from the prior Japanese Patent Application No. 2011-066489, filed on Mar. 24, 2011, the entire content is incorporated herein by reference.

BACKGROUND OF THE INVENTION

1. Field of the Invention

The present invention relates to a bit length converting circuit, for floating-point numbers, suitable for reducing the amount of calculation and circuit scale, and a vibration correction control circuit using the bit length converting circuit.

2. Description of the Related Art

Digital still cameras and digital movie cameras (hereinafter generically referred to as digital cameras) have been widely used by general users. Users who are not familiar with how to handle the cameras properly are likely to encounter camera shake when taking pictures. Note here that the term "camera shake" will be hereinafter referred to simply as "shake". Also, the digital camera is generally assembled into a mobile device such as a mobile phone, a smart phone, and a PDA (Personal Digital Assistant). Most of the cameras incorporated into such mobile devices are so designed that the camera is held by one hand only while taking pictures or video. Where the camera is held by one hand, the shake is more likely to occur as compared with when the camera is held by both hands to take pictures or video.

An optical shake correction method is available to correct the shake. In this optical shake correction method, an optical axis is corrected by a vibration detecting element for detecting the vibration of a camera and a driver element that moves a lens position in such a direction as to cancel out the displacement caused by the vibration. Generally used is a mechanism where a lens is mounted within a correction frame using a spring and the position of the lens is moved by an X-axis actuator and a Y-axis actuator in such a direction as to cancel out the displacement caused by the vibration.

For an optical shake correction using the above-described mechanism, it is conceivable that the output values of the vibration detecting element (e.g., gyro sensor) are represented by floating-point numbers. The floating-point numbers are widely used as a method for representing decimal numbers. The IEEE 754 format is a representative method for representing floating-point numbers. The IEEE 754 format has a single precision representation and a double precision representation. In the single precision representation represented by a total of 32 bits, a sign part is represented by 1 bit, an exponent part by 8 bits, and a fraction part (mantissa) by 23 bits.

However, the floating-point number of 32 bits is more than necessary for the above-described shake correction. For that purpose, the 32 bits require too large a circuit size, which results in a loss of efficiency. Thus, arithmetical operations may be done using a bit length of the floating-point number long enough to meet the actual needs. However, a problem with such a proposition is the inflexibility of general CPUs and external digital circuits in handling the interfaces other than 32 bits and 64 bits. In other words, the existing computational resources cannot be put to ready use.

SUMMARY OF THE INVENTION

A bit length converting circuit for floating-point numbers according to one embodiment of the present invention includes: a bit length reducing unit configured to reduce a bit length of an operand expressed by a floating-point number and configured to output the operand to a computing unit; and a bit length increasing unit configured to increase the bit length of a result value of operation represented by the floating-point number inputted from the computing unit and configured to restore an original bit length. The bit length reducing unit discard a predetermined number of higher-order bits of the exponent part of the floating-point number and adds a positive or negative offset value to the exponent part with the higher-order bits discarded, according to an application to be executed by the computing unit, and the bit length increasing unit restores a bit discarded by the bit length reducing unit from the exponent part of the floating-point number and subtracts the offset value from the exponent part thereof.

Another embodiment of the present invention relates to a vibration correction control circuit. The vibration correction control circuit is a vibration correction control circuit for correcting an optical axis of an image pickup apparatus in response to a vibration thereof, and the circuit includes: a vibration-component signal generating unit configured to generate a vibration-component signal indicating an amount of movement of an image pickup apparatus according to an output signal of a vibration detecting element for detecting a vibration of the image pickup apparatus; a driver signal generating unit configured to generate a drive signal used to control a driver element to correct a position of a lens, based on an output signal of a position detecting element for detecting the position of the lens to be driven and the vibration-component signal; and the above-described bit length converting circuit for floating-point numbers configured to convert the bit length of the output signal of the vibration detecting element expressed by the floating-point number. The vibration-component signal generating unit includes: a high-pass filter configured to filter the output signal of the vibration detecting element, whose bit length has been converted by the bit length converting circuit, with a preset cutoff frequency; and an integration circuit configured to generate the vibration-component signal by integrating an output signal of the high-pass filter. The high-pass filter and the integrating circuit comprises digital filters.

Another embodiment of the present invention relates also to a vibration correction control circuit. The vibration correction control circuit is a vibration correction control circuit for correcting an optical axis of an image pickup apparatus in response to a vibration thereof, and the circuit includes: a vibration-component signal generating unit configured to generate a vibration-component signal indicating an amount of movement of an image pickup apparatus according to an output signal of a vibration detecting element for detecting a vibration of the image pickup apparatus; a driver signal generating unit configured to generate a drive signal used to control a driver element to correct a position of image pickup devices, based on an output signal of a position detecting element for detecting the position of the image pickup devices to be driven and the vibration-component signal; and the above-described bit length converting circuit for floating-point numbers configured to convert the bit length of the output signal of the vibration detecting element expressed by the floating-point number. The vibration-component signal generating unit includes: a high-pass filter configured to filter the output signal of the vibration detecting element, whose bit length has been converted by the bit length converting circuit, with a preset cutoff frequency; and an integration circuit configured to generate the vibration-component signal by integrating an output signal of the high-pass filter. The high-pass filter and the integrating circuit comprises digital filters.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Figure 1:
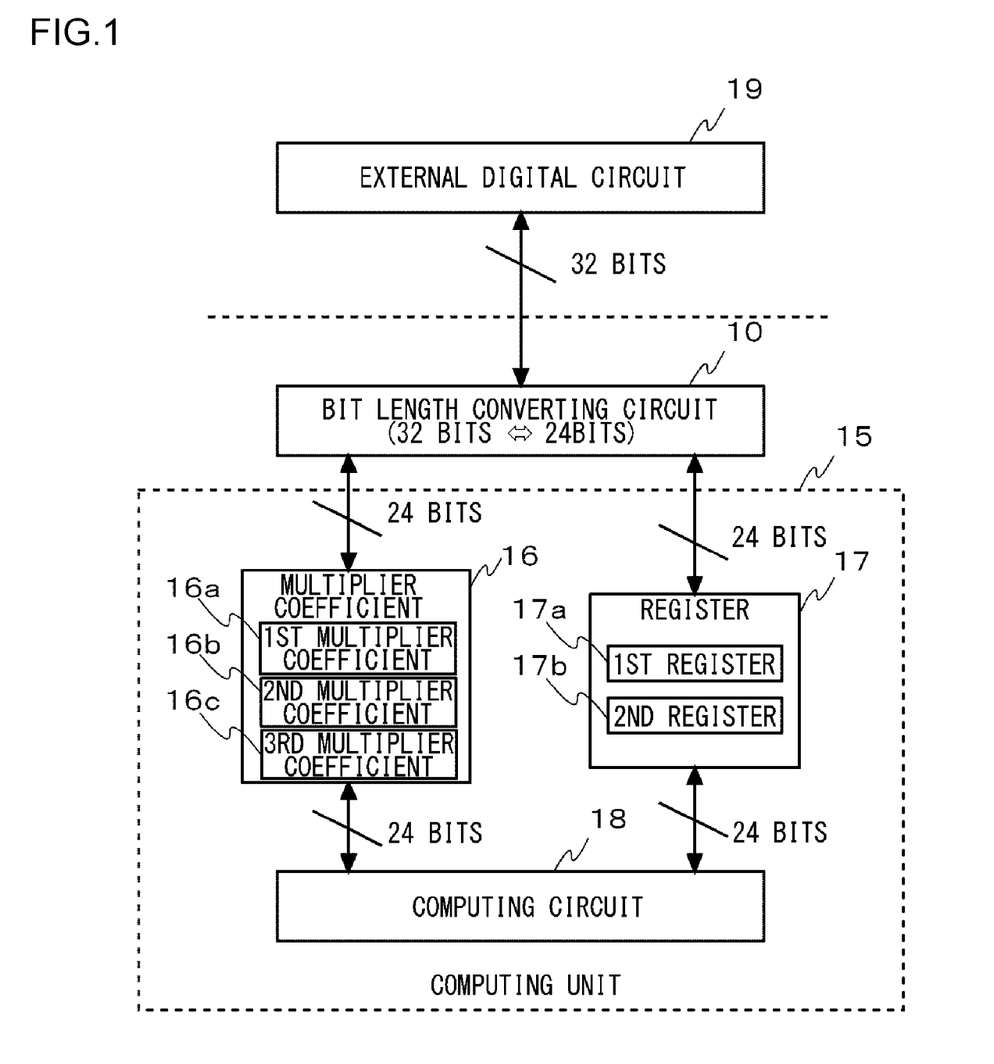
FIG. 1 is a diagram to explain a bit length converting circuit for floating-point numbers according to an embodiment of the present invention.

FIG. 1 is a diagram to explain a bit length converting circuit 10 for floating-point numbers according to an embodiment of the present invention. The bit length converting circuit 10 receives an operand (32 bit data in the present embodiment), which is expressed by a single-precision floating-point number, from an external digital circuit 19. The external circuit 29 may include CPUs or various types of logic circuits. These components may be installed in an external device.

The bit length converting circuit 10 converts the bit length of an operand expressed by a floating-point number. In the present embodiment, 32-bit data is converted to 24-bit data. The bit length converting circuit 10 outputs the operand after the bit length conversion, to a computing unit 15. As described earlier, the 32-bit data is constituted by a 1-bit sign part, an 8-bit exponent part, and a 23-bit fraction part. The 24-bit data is constituted by a 1-bit sign part, a 5-bit exponent part, and a 18-bit fraction part.

The computing unit 15, which is a digital circuit for performing arithmetic operation, includes a multiplier coefficient 16, a register 17, and a computing circuit 18. The multiplier coefficient 16 and the register 17 are comprised of RAMs (Random Access Memories). The multiplier coefficient 16 includes a first multiplier coefficient 16a, a second multiplier coefficient 16b, and a third multiplier coefficient 16c. The register 17 includes a first register 17a and a second register 17b. The computing circuit 18 is comprised of a plurality of computing units.

Figure 2:
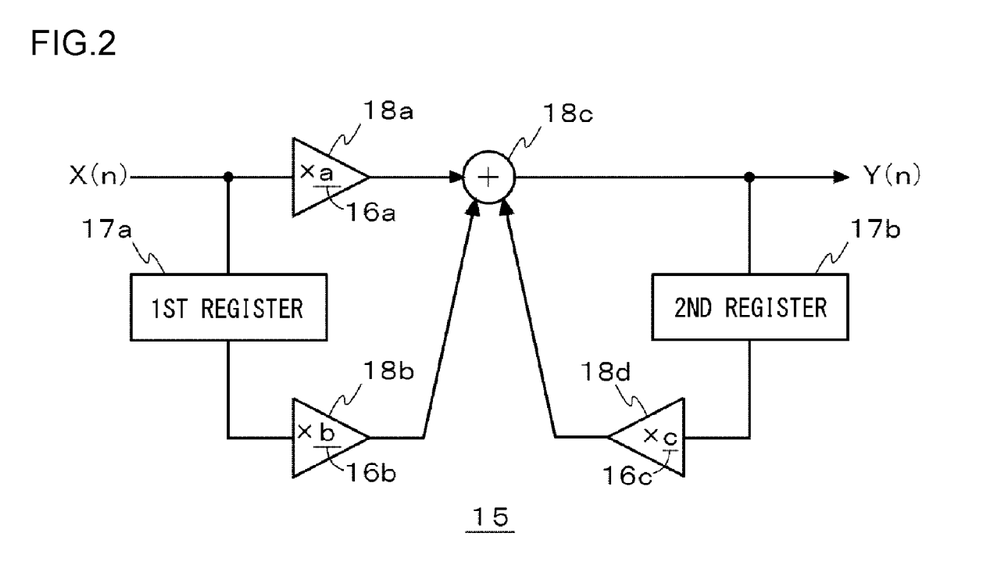
FIG. 2 is a diagram showing an exemplary structure of a computing unit.

FIG. 2 is a diagram showing an exemplary structure of the computing unit 15. FIG. 2 shows an example where the computing unit 15 is configured by a digital filter. The digital filter includes a first multiplier 18a, a first register 17a, a second multiplier 18b, an adder 18c, a second register 17b, and a third multiplier 18d. The first multiplier 18a multiplies an input value X(n) by the first multiplier coefficient 16a. The first register 17a temporarily holds the input value X(n). The second multiplier 18b multiplies an input value X(n−1) held by the first register 17a one sampling period previously, by the second multiplier coefficient 16b. The adder 18c adds up the output value of the first multiplier 18a, the output value of the second multiplier 18b and the output value of the third multiplier 18d. The second register 17b temporarily holds the output value of the adder 18c. The third multiplier 18d multiplies an output value Y(n−1) held by the second register 17b one sampling period previously, by the third multiplier coefficient 16c.

In other words, the digital filter carries out an operation expressed by the following Equation (1).

$$Y(n)=X(n)\cdot a+X(n-1)\cdot b+Y(n-1)\cdot c \quad \text{(Equation 1)}$$

In this Equation (1), X(n) (1=1, 2, 3, . . . ) indicates an input value, Y(n) an output value, a the first multiplier coefficient 16a, b the second multiplier coefficient 16b, and c the third multiplier coefficient 16c.

When the digital filter is used as a low-pass filter, the coefficient a of the first multiplier 18a, the coefficient b of the second multiplier 18b, and the coefficient c of the third multiplier 18d are so set as to satisfy the relationship of the following Equation/Inequality 2.

$$(0<)a \approx b << c \quad \text{(Equation/Inequality 2)}$$

In this case, the action of a system formed by the second register 17b and the third multiplier 18d will increase, thereby performing mainly the function of cumulative addition. Accordingly, the digital filter will have an integrating function, and the values of integrals will be stored in the second register 17b. It is to be noted here that approximately the same value is set for the coefficient a and the coefficient b in order to reduce random noise by adding the delay component of the input value of one sampling period before. Also, note that the smaller the coefficient a and the coefficient b are set in relation to the coefficient c, the more effective it will be in suppressing the rise in the value of integral.

When the digital filter is used as a high-pass filter, the coefficient a of the first multiplier 18a, the coefficient b of the second multiplier 18b, and the coefficient c of the third multiplier 18d are so set as to satisfy the relationship of the following Equation 3 and Inequality 4.

$$a \approx -b \quad \text{(Equation 3)}$$

$$c>0 \quad \text{(Inequality 4)}$$

In this case, the sum of the output of the first multiplier 18a and the output of the second multiplier 18b added by the adder 18c represents a variation in input value during one sampling period. As the variation is cumulatively added using a system formed by the second register 17b and the third multiplier 18d, the high-pass filter serves as a filter outputting high-frequency components only.

That is, when the frequency of the input value is low, its variation will be small and therefore the variation in the output value will be small even though the variation in the input value is added to the output value of one sampling period before. As a result, it appears as if the low-frequency components are not passing. On the other hand, when the frequency of the input value is high, its variation will be large and therefore the variation in the output value will be large when the variation in the input value is added to the output value of one sampling period before.

Figure 3:
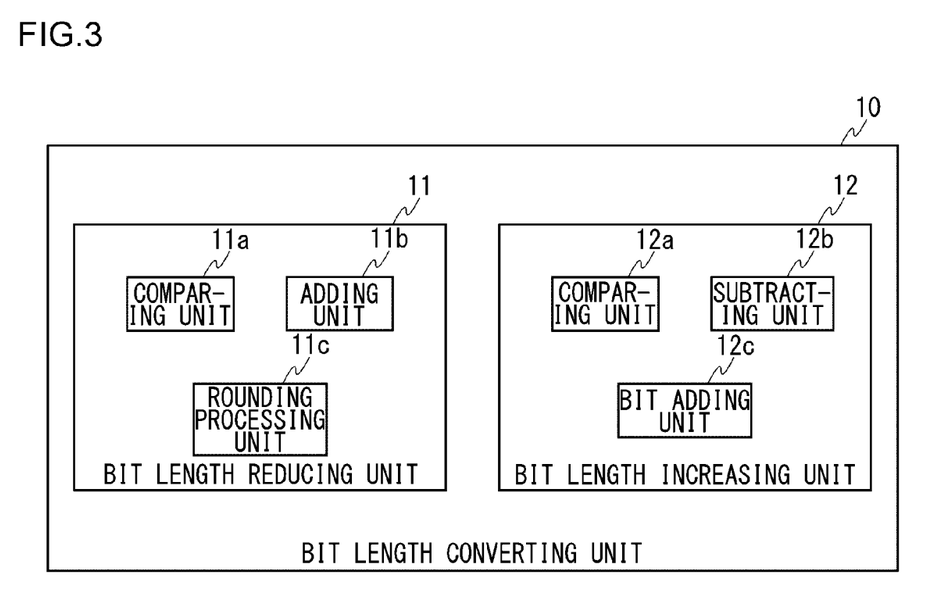
FIG. 3 is a diagram showing a structure of a bit length converting circuit for floating-point numbers according to an embodiment of the present invention.

FIG. 3 is a diagram showing a structure of the bit length converting circuit 10 for floating-point numbers according to an embodiment of the present invention. The bit length converting circuit 10 includes a bit length reducing unit 11 and a bit length increasing unit 12. The bit length reducing unit 11 reduces the bit length of an operand represented by a floating-point number and outputs the resulting operand to the computing unit 15. More specifically, the bit length reducing unit 11 discards a predetermined number of higher-order bits of the exponent part of a floating-point number and at the same time adds a positive or negative offset value to the exponent part with the higher-order bits discarded, according to an application to be executed by the computing unit 15. Note that when the highest-order bit of the exponent part is a sign bit indicating the sign of the exponent, the discarding is done excepting the sign bit. Also, the bit length reducing unit 11 discards a predetermined number of lower-order bits of the fraction part of the floating-point number by performing a rounding processing thereon.

The bit length reducing unit 11 includes a comparing unit 11a, an adding unit 11b, and a rounding processing unit 11c. The comparing unit 11a compares the exponent part of the operand represented by a floating-point number against a predetermined upper limit value. When the former is equal to or above the latter, the comparing unit 11a substitutes the maximum value after the bit length reduction for the value of the exponent part. When the former is strictly below the latter, the comparing unit 11a compares the exponent part of the operand against a predetermined lower limit value. When the former is equal to or below the latter, the comparing unit 11a substitutes the minimum value after the bit length reduction for the value of the exponent part. When the former is strictly below the latter, the adding unit 11b adds a positive or negative fixed value to the value of the exponent part. Note that a specific example of bit length reduction processing of an exponent part will be described later.

The rounding processing unit 11c reduces the bit length of the fraction part of the operand represented by a floating-point number by rounding lower-order bits of the fraction part. Note that a specific example of rounding processing will be described later.

The bit length increasing unit 12 restores the original bit length by increasing the bit length of the result value of operation represented by a floating-point number which is inputted from the computing unit 15. More specifically, the bit length increasing unit 12 restores the bits discarded by the bit length reducing unit 11 in the exponent part of the floating-point number and at the same time subtracts an offset value. Also, the bit length increasing unit 12 places zeros in the bit positions, of the fraction part of the floating-point number, which is discarded by the bit length reducing unit 11 and thereby restores the bit length of the fraction part thereof to the original bit length.

The bit length increasing unit 12 includes a comparing unit 12a, a subtracting unit 12b, and a bit adding unit 12c. The comparing unit 12a compares the exponent part of the result value of operation represented by a floating-point number against a predetermined maximum value. When the former is equal to the latter, the comparing unit 12a substitutes the above-mentioned predetermined upper limit value for the value of the exponent part. When the former is different from the latter, the comparing unit 12a compares the exponent part of the result value of operation against a predetermined minimum value. When the former is equal to the latter, the comparing unit 12a substitutes the above-mentioned predetermined lower limit for the value of the exponent part. When the former is different from the latter, the subtracting unit 12b subtracts the above-mentioned fixed value from the value of the exponent part. Note that a specific example of bit length increasing processing of an exponent part will be described later.

The bit adding unit 12c adds $(0)_2$ by the number of bits discarded by the rounding processing unit 11c to the lower-order bits of the fraction part of the result value of operation represented by a floating-point number. Note that a specific example of bit adding processing will be described later.

Figure 4:
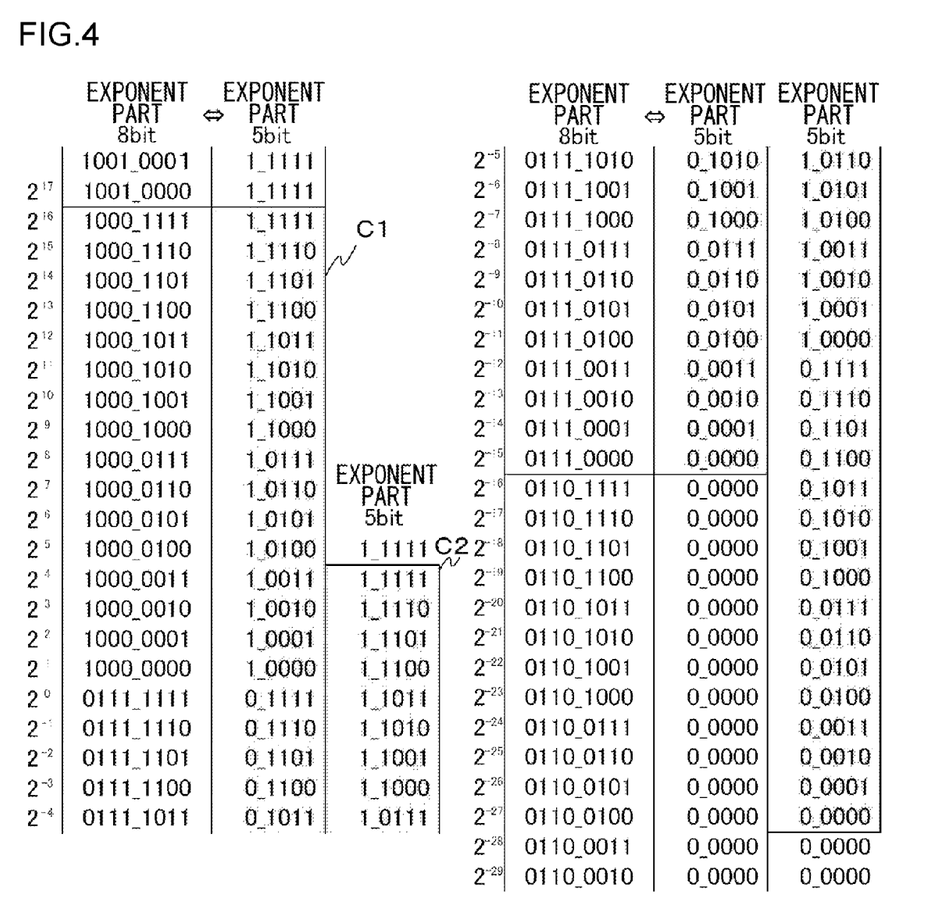
FIG. 4 is a diagram by which to explain an example of bit length conversion processing of an exponent part.

FIG. 4 is a diagram by which to explain an example of bit length conversion processing of the exponent part. In the present embodiment, the exponent part is subjected to 8-bit/5-bit conversion. When the exponent part is represented by 8 bits and the center is set as $2^0=1$, the exponent part ranges from +128 to −127. Here, the highest-order bit (the most significant bit) is a sign bit. In the example shown in FIG. 4, the highest-order bit of $(1)_2$ represents a positive number, and that of $(0)_2$ represents a negative number. Note that the 0th power of $2^0$ is represented by $(01111111)_2$.

When the exponent part of 8 bits represented as above is converted simply to the exponent part of 5 bits, the exponent part ranges from −15 to +16 (see C1 in FIG. 4). That is, three higher-order bits excepting the highest-order bit are discarded. Shown in FIG. 4 is an example of shifting the range of this 5-bit exponent to −27 to +4 (see C2 in FIG. 4). Hereinbelow, a description will be given of a concrete processing to effect this shift. As premises, the value of the exponent part of the operand is expressed as $(xxxxxxxx)_2$, and the value of the exponent part of the result value of operation is expressed as $(yyyyy)_2$.

The comparing unit 11a compares $(xxxxxxxx)_2$ against $(10000011)_2$. $(10000011)_2$ corresponds to the above-mentioned predetermined upper limit value. When $(xxxxxxxx)_2$ is greater than or equal to $(10000011)_2$, the comparing unit 11a substitutes $(11111)_2$ for $(xxxxxxxx)_2$. When $(xxxxxxxx)_2$ is less than $(10000011)_2$, the comparing unit 11a compares $(xxxxxxxx)_2$ against $(01100100)_2$. $(01100100)_2$ corresponds to the above-mentioned predetermined lower limit value. When $(xxxxxxxx)_2$ is less than or equal to $(01100100)_2$, the comparing unit 11a substitutes $(00000)_2$ for $(xxxxxxxx)_2$. When $(xxxxxxxx)_2$ is less than $(10000011)_2$, the adding unit 11b subtracts $(01100100)_2$ from $(xxxxxxxx)_2$.

The comparing unit 12a compares $(yyyyy)_2$ against $(11111)_2$. When they are equal to each other, the comparing unit 12a substitutes $(10000011)_2$ for $(yyyyy)_2$. When they are different from each other, the comparing unit 12a compares $(yyyyy)_2$ against $(00000)_2$. When they are equal to each other, the comparing unit 12a substitutes $(01100100)_2$ for $(yyyyy)_2$. When they are different from each other, the subtracting unit 12b adds $(01100100)_2$ to $(yyyyy)_2$.

The conversion method as shown in FIG. 4 is well suited to a shake correction to be discussed later. Since the shake correction handles a low-frequency band, it is important that the values in decimal places be represented more closely and finely. Therefore, the center of the represented range of the exponent is shifted from $2^0$ to a smaller value, so that an effective arithmetic operation is realized with a shorter bit length. When the exponent part is simply converted from 8 bits to 5 bits, $(01111)_2$ is $2^0$, and the represented range of the exponent part is from $2^{-15}$ to $2^{16}$. This represented range does not adequately secure a dynamic range which is necessary for the arithmetic operations of shake correction. Hence, $2^0$ is shifted to $(11011)_2$, so that the represented range of the exponent part is from $2^{-27}$ to $2^4$. Now the represented range secures a dynamic range necessary for the arithmetic operations of shake correction.

Figure 5:
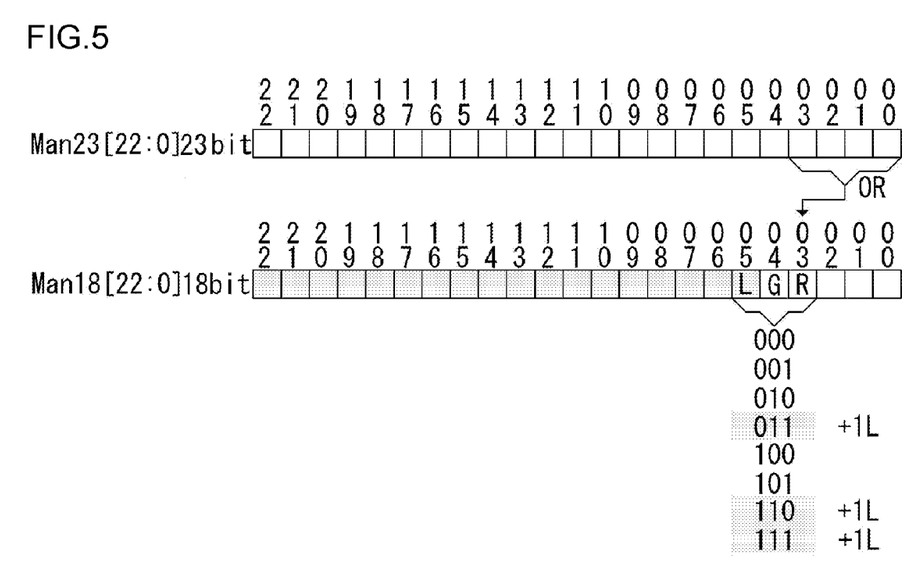
FIG. 5 is a diagram showing an example of rounding processing for a fraction part.

FIG. 5 is a diagram showing an example of rounding processing for the fraction part. In this embodiment, 23-bit data is converted to 18-bit data by applying a rounding processing to the 6 lower-order bits. The example shown in FIG. 5 represents a case of rounding to the nearest even number. In a rounding to the nearest even number, the fraction smaller than 0.5 is rounded down, the fraction larger than 0.5 is rounded up, and the fraction of 0.5 is rounded either down or up to the nearest even number. This rounding processing is advantageous in that it produces least accumulation of rounding errors.

In FIG. 5, the rounding processing unit 11c performs an operation of a logical sum of the 4 lower-order bits of the 23-bit data. That is, when at least one of the 4 lower-order bits is $(1)_2$, the 4th lowest-order bit is set to $(1)_2$, and when all of them are $(0)_2$, the 4th lowest-order bit is set to $(0)_2$. Then the rounding processing unit 11c performs a rounding processing on the three bits of the 4th to 6th lowest-order bits. Note that the weight of the digit is 1 for the 6th lowest-order bit (L), 0.5 for the 5th lowest-order bit (G), and 0.25 for the 4th lowest-order bit (R).

When the above-mentioned three bits are $(000)_2$, $(001)_2$, $(100)_2$ and $(101)_2$, the total of the 5th lowest-order bit and the 4th lowest-order bit is smaller than 0.5 and therefore those two bits are rounded down. When those three bits are $(011)_2$ and $(111)_2$, the total of the 5th lowest-order bit and the 4th lowest-order bit is larger than 0.5 and therefore those two bits are rounded up. That is, $(1)_2$ is added to the 6th lowest-order bit. When they are $(010)_2$ only, a normal rounding off results in a rounding up. However, since the result of the rounding up is an odd number, the above-described rounding to the nearest even number results in a rounding down. When they are $(110)_2$ only, the result of rounding up is an even number, so that the rounding up is used.

Figure 6:
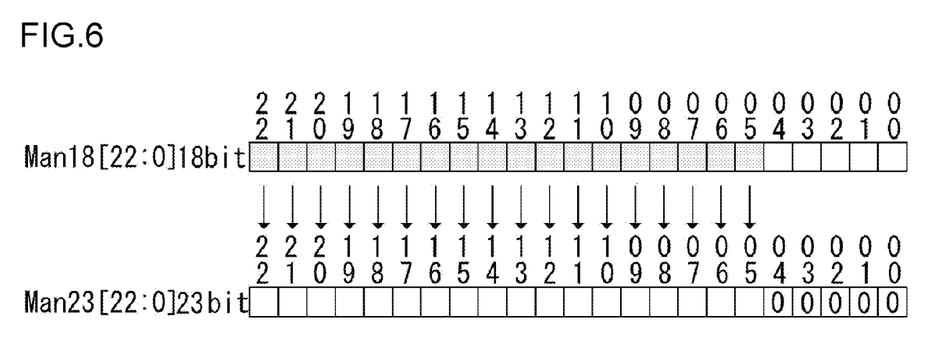
FIG. 6 is a diagram showing an example of bit adding processing for a fraction part.

FIG. 6 is a diagram showing an example of bit adding processing for a fraction part. As shown in FIG. 6, the bit adding unit 12c adds $(00000)_2$ to the 6 lower-order bits of 18-bit data so as to be converted to 23-bit data.

Figure 7:
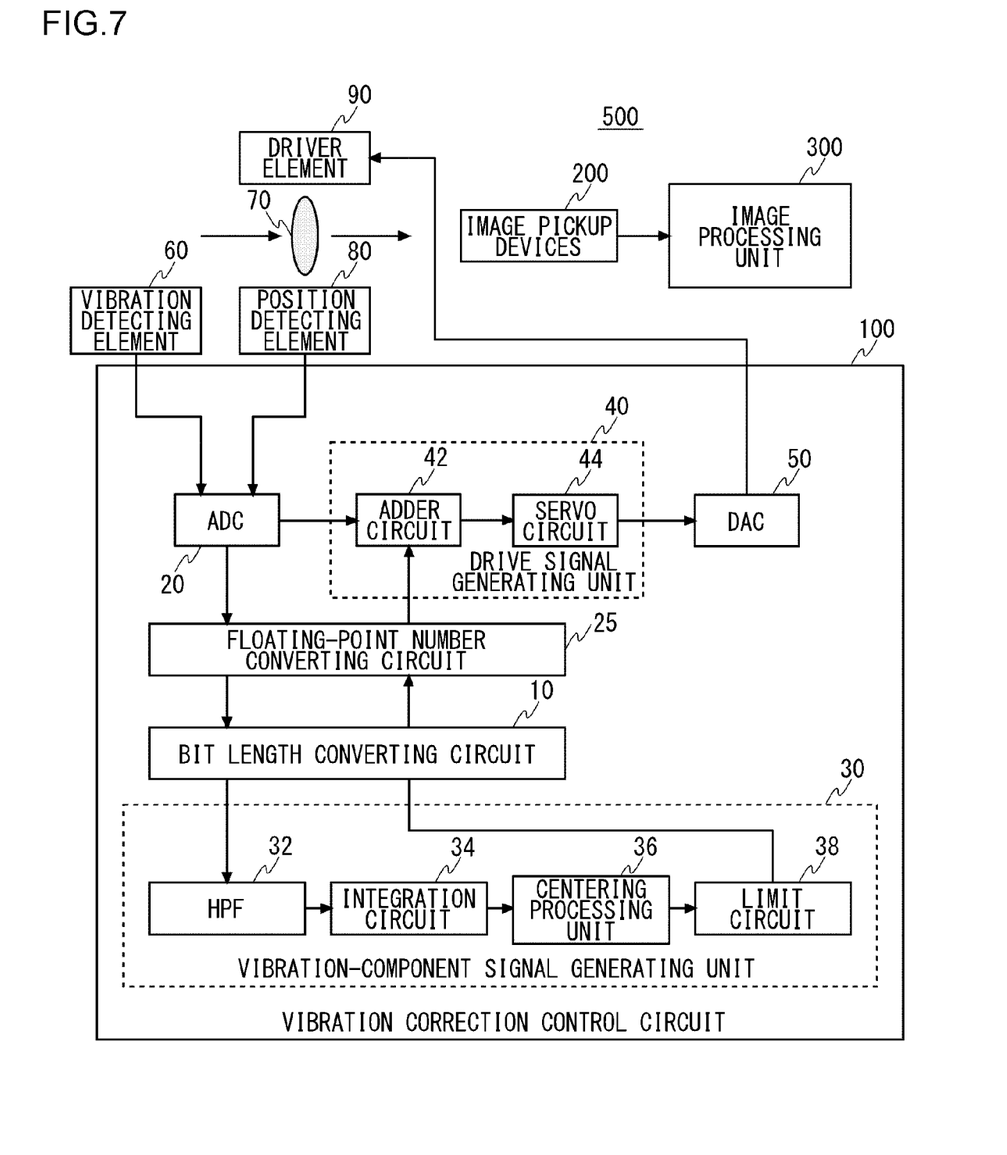
FIG. 7 is a block diagram showing a structure of an image pickup apparatus incorporating a vibration correction control circuit according to an embodiment of the present invention.

FIG. 7 is a block diagram showing a structure of an image pickup apparatus 500 incorporating a vibration correction control circuit 100 according to an embodiment of the present invention. The image pickup apparatus 500 includes a lens 70, a driver element 90, a position detecting element 80, a vibration detecting element 60, a vibration correction control circuit 100, image pickup devices 200, and an image processing unit 300.

The vibration correction control circuit 100 includes an analog-to-digital converter (ADC) 20, a floating-point number converting circuit 25, a bit length converting circuit 10, a vibration-component signal generating unit 30, a drive signal generating unit 40, and a digital-to-analog converter (DAC) 50. The vibration-component signal generating unit 30 includes a high-pass filter (HPF) 32, an integration unit 34, a centering processing unit 36, and a limit circuit 38. The drive signal generating unit 40 includes an adder circuit 42 and a servo circuit 44.

The image pickup devices 200 convert the light signals transmitted through the lens 70 which is an optical component, into electric signals. The image pickup devices 200 may be CCD (charge-coupled device) sensors and CMOS (complementary metal-oxide semiconductor) image sensors. The image processing unit 300 performs various processings on image signals picked up by the image pickup devices 200 and compresses and codes them.

The driver element 90 drives the lens 70. The position detecting element 80 detects the position of the lens 70. The vibration detecting element 60 detects the vibration applied to the image pickup apparatus 500. The bit length converting circuit 10 converts the bit length of an output signal of the vibration detecting element 60 expressed by a floating-point number. More specifically, the bit length reducing unit 11 discards a predetermined number of higher-order bits of the exponent part of the floating-point number and at the same time adds a negative offset value to the exponent part with the higher-order bits discarded, according to an arithmetic operation processing executed by the HPF 32 and the integration circuit 34. In response to this, the bit length increasing unit 12 restores the bits discarded by the bit length reducing unit 11 from the exponent part of the floating-point number and at the same time subtracts the negative offset value. The processing for the fraction part of the floating-point number is as described above.

The vibration-component signal generating unit 30 obtains an amount of movement of the image pickup apparatus 500 in response to an output signal of the vibration detecting element 60, and generates a vibration-component signal used to correct this amount of amount. The movement amount of the image pickup apparatus 500 can be obtained by integrating the outputs of the vibration detecting element 60.

To correct the position of the lens 70, the drive signal generating unit 40 generates a drive signal with which to control the driver element 90, based on the output signal of the position detecting element 80 and the signal generated by the vibration-component signal generating unit 30. Based on this signal, the driver element 90 controls the position of the lens 70 so that the optical axis of the lens 70 agrees with the center of the image pickup devices 200.

A concrete description is given hereunder of a structure and an operation of the vibration correction control circuit 100. The vibration correction control circuit 100 is hereinbelow described using an example where a gyro sensor 60a is used as the vibration detecting element 60, a hall element 80a is used as the position detecting element 80, and a voice coil motor 90a is used as the driver element 90. The gyro sensor 60a is a sensor that detects the vibration caused by a shake of a user holding the image pickup apparatus 500 as an angular velocity.

The gyro sensor 60a detects angular velocities in two directions (X-axis and Y-axis directions) of the image pickup apparatus 500. After an analog angular velocity signal obtained by the gyro sensor is amplified by a not-shown amplifier circuit, the amplified signal is outputted to the ADC 20. The ADC 20 converts the analog angular velocity signal amplified by the amplifier circuit into a digital angular velocity signal. The angular velocity signal outputted from the ADC 20 is outputted to the floating-point number converting circuit 25.

The floating-point number converting circuit 25 converts an angular velocity signal in a fixed-point format outputted from the ADC 20 into a 32-bit angular velocity signal in a floating-point number format, and then outputs the thus converted signal to the bit length converting circuit 10. The bit length converting circuit 10 converts the 32-bit angular velocity signal in the floating-point number format into a 24-bit angular velocity signal in the floating-point number format. The bit length converting circuit 10 performs the bit length conversion as described above in conjunction with FIG. 1 to FIG. 6. The bit length converting circuit 10 outputs the 24-bit angular velocity signal in the floating-point number format to the vibration-component signal generating unit 30.

The vibration-component signal generating unit 30 corresponds to the above-described computing unit 15. That is, the computing unit 15 obtains the amount of movement of the image pickup apparatus 500 in response to the output signal of the vibration detecting element 60, and executes an application in which the vibration-component signal to correct the movement amount is produced.

The angular velocity signal outputted from the bit length converting circuit 10 is inputted to the HPF 32. The HPF 32 filters frequency components, in the angular velocity signal outputted from the gyro sensor 60a, which are lower than the frequency components due to the shake, and thereby removes said frequency components. In general, the frequency components due to the shake lie in the range of 1 to 20 Hz but considered in the present embodiment is an example where the cutoff frequency is set to a low value in consideration of a heavy camera such as a single-lens reflex camera. For example, the cutoff frequency is set to 0.01 Hz and the frequency components lower than or equal to 0.01 Hz are removed from the angular velocity signal.

The integration circuit 34 integrates the angular velocity signals filtered by the HPF 32 and thereby generates the vibration-component signal indicating the amount of movement of the image pickup apparatus 500. The centering processing circuit 36 adjusts the vibration-component signal generated by the integration circuit 34 towards the origin direction. Note that the centering processing circuit 36 is turned off while still images are being taken. The limit circuit 38 sets a limit, which corresponds to the movable range of the lens 70, to the vibration-component signal which has been adjusted towards the origin by the centering processing circuit 36.

In the present embodiment, the integration circuit 34 and the centering processing circuit 36 are configured by the digital filters as shown in FIG. 2. The integration circuit 34 may be comprised of a low-pass filter, whereas the centering processing circuit 36 may be comprised of a high-pass filter. If the integration circuit 34 is to be configured by the digital filter as shown in FIG. 2, the sensitivity in the vibration correction processing may be adjusted by adjusting the ratios between the coefficients a, b and c of the digital filter of FIG. 2.

The bit length converting circuit 10 converts the 24-bit vibration-component signal in the floating-point number format outputted from the vibration-component signal generating unit 30 into a 32-bit vibration-component signal in the floating-point number format, and outputs the thus converted signal to the floating-point number converting circuit 25. The floating-point number converting circuit 25 converts the vibration-component signal outputted from the bit length converting circuit 10 in the floating-point number format into a vibration-component signal in the fixed-point format, and outputs the thus converted signal to the drive signal generating unit 40 (more precisely, the adder circuit 42).

The hall element 80a, which is a magnetic sensor using the Hall effect, functions as the position detecting element that detects the position in the X and Y directions of the lens 70. An analog position signal containing the position information on the lens 70 obtained by the hall element 80a is amplified by the not-shown amplifier circuit and is then outputted to the ADC 20. The ADC 20 converts the analog position signal amplified by this amplifier circuit into a digital position signal. The ADC 20 converts the aforementioned analog angular velocity signal and analog position signal into their digital signals in a time sharing manner. It is to be noted that, instead of installing the ADC 20 in the vibration correction control circuit 100, the ADCs 20 may be installed in a modularized gyro sensor 60a and a modularized hall element 80a, respectively.

The position signal outputted from the ADC 20 is outputted to the drive signal generating unit 40. Note that the position signal is not converted into a floating-point number but remains intact as the signal in the fixed floating-point format. The position signal and the vibration-component signal outputted from the floating-point number converting unit 25 are inputted to the adder circuit 42 of the drive signal generating unit 40. The adder circuit 42 adds up the inputted position signal and the inputted vibration-component signal, and outputs it to the servo circuit 44. In response to the output signal from the adder circuit 42, the servo circuit 44 generates a drive signal used to control the drive of the voice coil motor 90a. Note that a filtering processing using a servo-control digital filter may be carried out in the servo circuit 44.

The DAC 50 converts the digital drive signal outputted from the servo circuit 44 into an analog drive signal. The drive signal is amplified by the not-shown amplifier circuit and is then outputted to the voice coil motor 90a. The voice coil motor 90a moves the position of the lens 70 in the X-axis and Y-axis directions, based on the drive signal.

A description is now given of operations of the image pickup apparatus 500 according to the present embodiment when no shake occurs and when shake occurs, respectively.

Operation when there is No Shake

Where no shake occurs, no angular velocity is produced in the image pickup apparatus 500, so that the signal outputted from the vibration-component signal generating unit 30 is "0". The lens 70 to be driven by the voice coil motor 90a lies in such a position that the optical axis thereof agrees with the center of the image pickup devices 200 provided in the image pickup apparatus 500. In this state, the position signal outputted from the hall element 80a is "0" and the servo circuit 44 outputs a drive signal, with which to maintain the position of the current position of the lens 70, to the voice coil motor 90a.

If the optical axis of the lens 70 does not agree with the center of the image pickup devices 200, the position signal outputted from the hall element 80a will be a value different from "0". And base on the value, the servo circuit 44 will output a drive signal, with which to adjust the value of the position signal to "0", to the voice coil motor 90. By repeating such an operation as this, the position of the lens 70 is controlled so that the optical axis of the lens 70 agrees with the center of the image pickup devices 200.

Operation in the Presence of Shake

As already described, the position of the lens 70 driven by the voice coil motor 90a is controlled such that the optical axis of the lens 70 is aligned with the center of the image pickup devices 200. When they are aligned with each other, the position signal outputted from the hall element 80a is "0".

On the other hand, with the movement of the image pickup apparatus 500 associated with shake, the vibration-component signal generating unit 30 outputs a vibration-component signal indicating the amount of movement of the image pickup apparatus 500 to the drive signal generating unit 40, based on an angular velocity signal detected by the gyro sensor 60a.

The adder circuit 42 adds the position signal "0" outputted by the hall element 80a and the vibration-component signal other than "0" outputted by the vibration-component signal generating unit 30 together. The servo circuit 44 generates a drive signal for the voice coil motor 90a in accordance with this signal. This drive signal serves as a correction signal for moving the lens 70. The voice coil motor 90a moves the lens 70 based on the correction signal outputted by the servo circuit 44. Thus, the image pickup devices 200 can obtain signals having reduced blur of an object due to the shake. With this control repeated, the shake correction control is accomplished.

Hereinbelow, a description will be given of the reason why the 8 bits of the exponent part of the floating-point number is converted to the 5 bits by the bit length converting circuit 10 and the represented range is shifted to from $2^{-27}$ to $2^4$. The band required for shake correction is approximately 1 to 20 Hz. To avoid any interference with the shake frequency band, the cutoff frequency of the HPF 32 is preferably 0.01 Hz or below.

With a digital filter as shown in FIG. 2, the filter coefficients a, b, and c, when the sampling frequency is 40 kHz and the cutoff frequency is 0.01 Hz, are as follows:

a=(3552D41C)$_{16}$
b=(B552D41C)$_{16}$
c=(3F7FFFE6)$_{16}$

Here, the exponent part of a and b will be $(01101010)_2 = 2^{-21}$, and the exponent part of c will be $(01111111)_2 = 2^0$ (see FIG. 4). In a simple bit deletion with $2^0$ at the center, 6 bits are required to represent $2^{-21}$ to $2^0$. Yet, if the represented range of $2^0$ at the center is shifted, 5 bits will suffice for the representation. In other words, shifting the represented range such that $2^{-21}$ to $2^0$ become the center thereof will allow 5 bits to represent $2^{-26}$ to $2^5$.

Let us consider cases where the value is $2^5$ or above at the integration circuit 34 and cases where the value is $2^{-26}$ or below at the HPF 32. Then there will be no overflow at the integration circuit 34 in normal shake correction operation. If the effect of errors resulting from the operations with $2^{-26}$ or below at the HPF 32 is to be further reduced, it will be meaningful to shift the represented range by 1 bit more to the negative side. That is, the above-mentioned range of the exponent part represented by 5 bits is set to $2^{-27}$ to $2^4$. This represented range not only prevents overflow at the integration circuit 34, but also raises the accuracy of shake correction most.

Note that at the occurrence of panning or tilting, there will be overflow at the integration circuit 34. However, if a panning or tilting is detected by a not-shown panning/tilting detection circuit, the signal to be inputted to the integration circuit 34 will be attenuated by a not-shown gain adjusting circuit provided anterior to the integration circuit 34.

Figure 8:
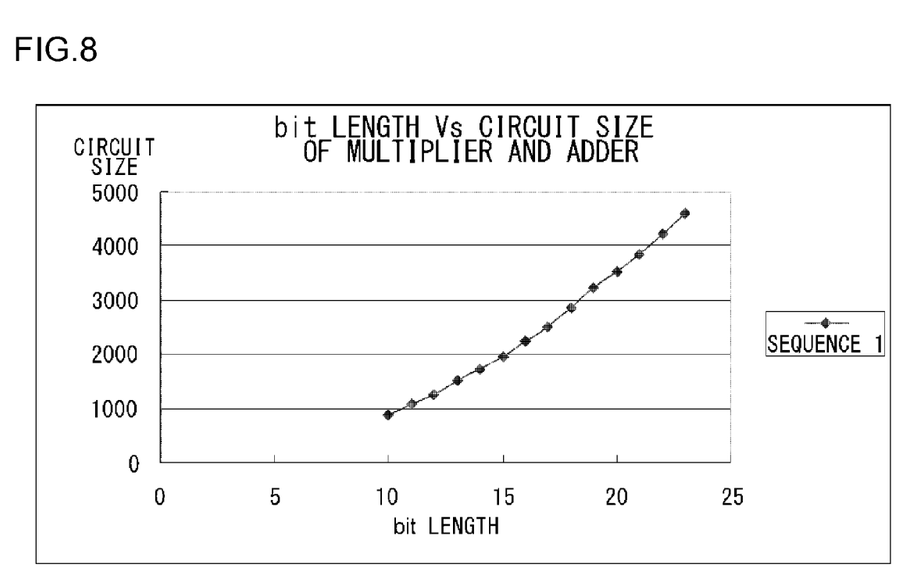
FIG. 8 is a diagram showing simulation results of a correspondence relationship between bit length and circuit size of a multiplier and an adder.

Now a description will be given of the reason why the 24 bits of the fraction part of the floating-point number is converted to the 18 bits by the bit length converting circuit 10. FIG. 8 is a diagram showing simulation results of a correspondence relationship between bit length and circuit size of the multiplier and the adder. Note that the circuit size is represented by normalized values. In the filter operation, multiplications and additions of the fraction part are carried out. As evident in FIG. 8, the multiplier and the adder show a tendency of quadratically increasing circuit size with the increase in bit length.

Figure 9:
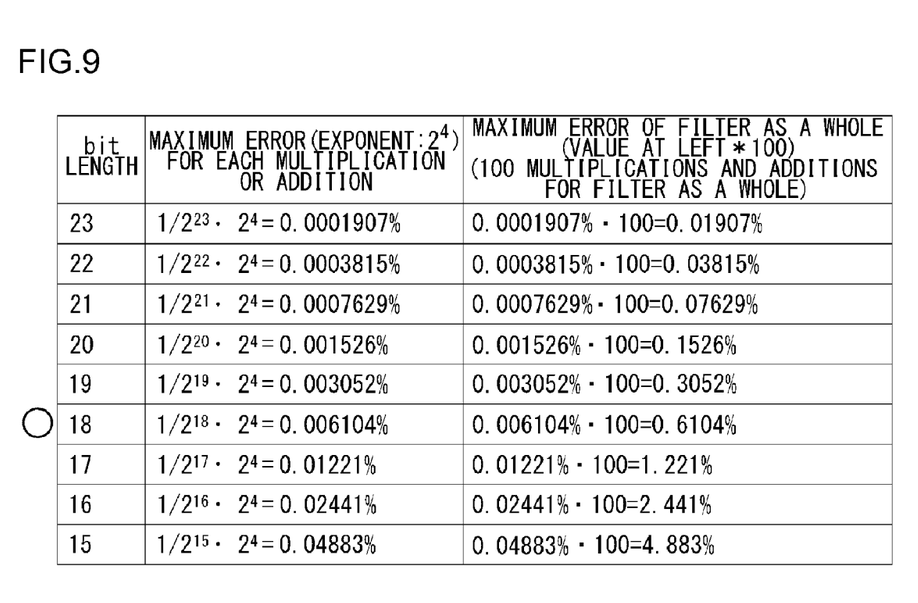
FIG. 9 is a table showing a correspondence relationship between the bit length and the operation error of a fraction part.

FIG. 9 is a table showing a correspondence relationship between the bit length and the operation error of the fraction part. It is to be noted that the exponent part is premised on being $2^4$. In the filter operation, the maximum error of the filter as a whole is preferably 1% or below if the effect of the operation error is to be ignored. Referring to FIG. 9, it can be seen that the maximum error of the filter as a whole is 1% or below when the bit length of the fraction part is 18 bits or more. Accordingly, 18 bits are employed in the present embodiment that can maintain the accuracy of arithmetic operations while suppressing the circuit size from increasing.

Thus, by employing the preferred embodiments of the present invention described so far, the circuit size suited to applications can be realized without losing compatibility with the existing computational resources. Hence, the size of the computing unit for executing the added application can be optimized while making effective use of the existing computational resources. In particular, when this invention is applied to the shake correction, the circuit size of the vibration-component signal generating unit 30 can be optimized to suit the arithmetic operations required therein while maintaining compatibility with the existing circuits other than the vibration-component signal generating unit 30. In doing so, the accuracy of arithmetic operations can be assured by shifting the represented range of the exponent part.

The present invention has been described based upon illustrative embodiments. These embodiments are intended to be illustrative only and it will be obvious to those skilled in the art that various modifications to the combination of constituting elements and processes could be developed and that such modifications are also within the scope of the present invention.

In the foregoing embodiments, an example of the bit length converting circuit 10 being applied to the vibration correction control circuit 100 has been described. However, the bit length converting circuit 10 may also be used in applications other than the vibration correction control circuit 100. For example, the bit length converting circuit 10 may be used in applications handling gigantic integers. In such a case, the represented range of the exponent part may be shifted in the positive side.

Also, in the foregoing embodiments, an example of the rounding processing unit 11c employing rounding to the nearest even number has been described. However, the rounding processing unit 11c may employ other types of rounding, such as counting fractions of 5 or 6 and over as a unit and disregarding the rest, random number rounding, and the like. Also, the rounding may be simple discarding of lower-order bits.

In the above-described embodiments, the gyro sensor 60a, the hall element 80a and the voice coil motor 90a function as the vibration detecting element 60, the position detecting element 80 and the driver element 90, respectively. However, embodiments of the present invention are not limited thereto. For example, a structure may be such that the vibration detecting element 60 detects the vibration of the image pickup apparatus 500, based on an acceleration signal, by the use of a sensor for detecting the acceleration in the rectilinear direction. A piezo element, a stepping motor or the like may be used for the driver element 90. An MR element, a photo screen diode or the like may be used for the position detecting element 80.

In the above-described embodiments, used is the lens-shift method for performing the shake correction processing by driving the lens. However, embodiments of the present invention are not limited thereto. For example, the present embodiments are applicable to an image pickup element shift method where the image pickup devices 200 are shifted according to a displacement in the position of the image pickup apparatus 500. In this case, the position detecting element 80 detects the position of the image pickup devices 200, the driver element 90 drives the image pickup devices 200.

What is claimed is:
1. A vibration correction control circuit for correcting an optical axis of an image pickup apparatus in response to a vibration thereof, the circuit comprising:
 a vibration-component signal generating unit configured to generate a vibration-component signal indicating an amount of movement of an image pickup apparatus according to an output signal of a vibration detecting element for detecting a vibration of the image pickup apparatus;

a driver signal generating unit configured to generate a drive signal used to control a driver element to correct a position of a lens, based on an output signal of a position detecting element for detecting the position of the lens to be driven and the vibration-component signal; and a bit length converting circuit for a floating-point number configured to convert the bit length of the output signal of the vibration detecting element expressed by the floating-point number, the bit length converting circuit comprising:

a bit length reducing unit configured to reduce a bit length of an operand expressed by the floating-point number and configured to output the operand to a computing unit; and a bit length increasing unit configured to increase the bit length of a result value of operation represented by the floating-point number inputted from the computing unit and configured to restore an original bit length, wherein said bit length reducing unit discards a predetermined number of higher-order bits of the exponent part of the floating-point number and adds a positive or negative offset value to the exponent part with the higher-order bits discarded, according to an application to be executed by the computing unit, and wherein said bit length increasing unit restores a bit discarded by the bit length reducing unit from the exponent part of the floating-point number and subtracts the offset value from the exponent part thereof, and wherein said vibration-component signal generating unit includes: a high-pass filter configured to filter the output signal of the vibration detecting element, whose bit length has been converted by said bit length converting circuit, with a preset cutoff frequency; and an integration circuit configured to generate the vibration-component signal by integrating an output signal of the high-pass filter, wherein the high-pass filter and the integrating circuit comprises digital filters.

2. A bit length converting circuit for floating-point numbers according to claim 1, wherein said bit length reducing unit discards a predetermined number of lower-order bits of the fraction part of the floating-point number by performing a rounding processing on the predetermined number of lower order bits thereof, and wherein said bit length increasing unit places zeros in bit positions, of the fraction part of the floating-point number, which is discarded by said bit length reducing unit and restores the bit length of the fraction part thereof to the original bit length.

3. A vibration correction control circuit according to claim 1, wherein said bit length reducing unit discards a predetermined number of higher-order bits of the exponent part of the floating-point number and adds a negative offset value to the exponent part with the higher-order bits discarded, according to an arithmetic operation processing executed by the high-pass filter and the integration circuit.

4. The bit length converting circuit of claim 1, wherein the bit length increasing unit comprises:
a comparing unit;
a subtracting unit coupled to the comparing unit; and
a bit adding unit coupled to the comparing unit and the subtracting unit.

5. A vibration correction control circuit for correcting an optical axis of an image pickup apparatus in response to a vibration thereof, the circuit comprising:

a vibration-component signal generating unit configured to generate a vibration-component signal indicating an amount of movement of an image pickup apparatus according to an output signal of a vibration detecting element for detecting a vibration of the image pickup apparatus;

a driver signal generating unit configured to generate a drive signal used to control a driver element to correct a position of image pickup devices, based on an output signal of a position detecting element for detecting the position of the image pickup devices to be driven and the vibration-component signal; and a bit length converting circuit for floating-point numbers configured to convert the bit length of the output signal of the vibration detecting element expressed by the floating-point numbers, the bit length converting circuit comprising:

a bit length reducing unit configured to reduce a bit length of an operand expressed by a floating-point number of the floating point numbers and configured to output the operand to a computing unit; and a bit length increasing unit configured to increase the bit length of a result value of operation represented by the floating-point number inputted from the computing unit and configured to restore an original bit length, wherein said bit length reducing unit discards a predetermined number of higher-order bits of the exponent part of the floating-point number and adds a positive or negative offset value to the exponent part with the higher-order bits discarded, according to an application to be executed by the computing unit, and wherein said bit length increasing unit restores a bit discarded by the bit length reducing unit from the exponent part of the floating-point number and subtracts the offset value from the exponent part thereof, and wherein, said vibration-component signal generating unit including: a high-pass filter configured to filter the output signal of the vibration detecting element, whose bit length has been converted by said bit length converting circuit, with a preset cutoff frequency; and an integration circuit configured to generate the vibration-component signal by integrating an output signal of the high-pass filter, wherein the high-pass filter and the integrating circuit comprises digital filters.

6. A vibration correction control circuit according to claim 5, wherein said bit length reducing unit discards a predetermined number of higher-order bits of the exponent part of the floating-point number and adds a negative offset value to the exponent part with the higher-order bits discarded, according to an arithmetic operation processing executed by the high-pass filter and the integration circuit.

7. The bit length converting circuit of claim 5, wherein the bit length increasing unit comprises:
a comparing unit;
a subtracting unit coupled to the comparing unit; and
a bit adding unit coupled to the comparing unit and the subtracting unit.

8. A bit length converting circuit for floating-point numbers according to claim 5, wherein said bit length reducing unit discards a predetermined number of lower-order bits of the fraction part of the floating-point number by performing a rounding processing on the predetermined number of lower order bits thereof, and wherein said bit length increasing unit places zeros in bit positions, of the fraction part of the floating-point number, which is discarded by said bit length reducing unit and restores the bit length of the fraction part thereof to the original bit length.

* * * * *